United States Patent [19]

Shieh et al.

[11] Patent Number: 5,654,228

[45] Date of Patent: *Aug. 5, 1997

[54] VCSEL HAVING A SELF-ALIGNED HEAT SINK AND METHOD OF MAKING

[75] Inventors: Chan-Long Shieh, Paradise Valley; John Lungo, Mesa; Michael S. Lebby, Apache Junction, all of Ariz.

[73] Assignee: Motorola, Schaumburg, Ill.

[*] Notice: The term of this patent shall not extend beyond the expiration date of Pat. No. 5,482,891.

[21] Appl. No.: 407,061

[22] Filed: Mar. 17, 1995

[51] Int. Cl.⁶ .................................................. H01L 21/20
[52] U.S. Cl. ............................ 438/32; 438/39; 438/584
[58] Field of Search .................................. 437/129, 209, 437/211; 148/DIG. 95

[56] References Cited

U.S. PATENT DOCUMENTS

| | | | |
|---|---|---|---|
| 5,206,871 | 4/1993 | Deppe et al. | 372/45 |
| 5,316,968 | 5/1994 | Choquette | 437/129 |
| 5,359,447 | 10/1994 | Hahn et al. | 359/154 |
| 5,422,901 | 6/1995 | Lebby et al. | 372/36 |
| 5,434,940 | 7/1995 | Roff et al. | 385/91 |
| 5,482,891 | 1/1996 | Shieh et al. | 437/129 |

*Primary Examiner*—Robert Kunemund
*Attorney, Agent, or Firm*—Eugene A. Parsons

[57] ABSTRACT

A substrate (102) having a surface (103) with a first stack of distributed Bragg reflectors (106), a first cladding region (107), an active region (108), a second cladding region (109), a second stack of distributed Bragg reflectors (110), and a contact region (111) is provided. A mesa (131) with a surface (133) and a trench (136) is formed. A first dielectric layer (122) is formed overlying substrate (102) and covering a portion of trench (136). A second dielectric layer (128) is formed on surface (133) of mesa (131). A seed layer (126) having a pattern is formed, with the pattern of seed layer (126) having an opening on a portion of second dielectric layer (128) of mesa (131). A metal is selectively plated on seed layer (126), thereby generating a layer (204) on seed layer (126) for removal of heat from VCSEL (101).

17 Claims, 2 Drawing Sheets

VCSEL HAVING A SELF-ALIGNED HEAT SINK AND METHOD OF MAKING

FIELD OF THE INVENTION

This invention relates, in general, to optical devices and, more particularly, to semiconductor lasers.

BACKGROUND OF THE INVENTION

At present, conventional edge emitting semiconductor lasers are playing a more significant role in optical communication due to their high operating efficiency and modulation capabilities; however, conventional edge emitting semiconductor lasers have several short comings or problems, such as a large size, a high cost, as well as manufacturing difficulties, thus making conventional edge emitting lasers unsuitable for high volume manufacturing.

Recently, however, there is an increased interest in a new type of laser called a vertical cavity surface emitting laser (VCSEL). The conventional VCSEL has a potential of several advantages, such as emitting light perpendicular to its die, providing a feasibility of array formation, integration with standard electronic components, as well as on-wafer testing. But, these potential advantages are not capable of being realized because the VCSEL has several problems, such as heat removal and fabrication complexity. Moreover, it should be understood that because of inadequate heat removal many other problems arise, such as reliability, die failure, and the like.

It can readily be seen that conventional edge emitting semiconductor lasers, as well as conventional VCSELs have several disadvantages and problems, thus not enabling their use in high volume manufacturing applications. Therefore, a VCSEL and method for making that removes heat from same, simplifies the fabrication process, reduces cost, with improved reliability would be highly desirable.

DETAILED DESCRIPTION OF THE DRAWINGS

Figure 1:
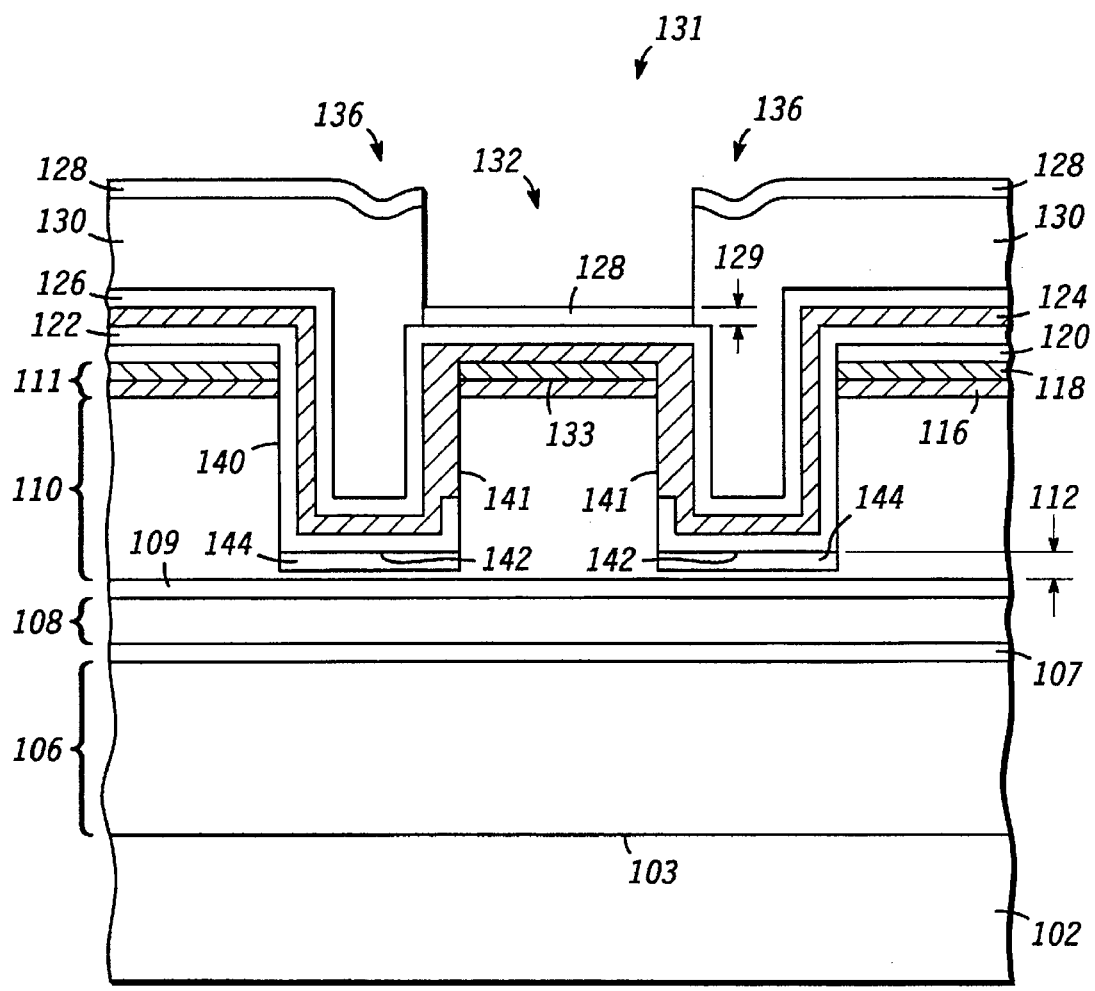
FIG. 1 illustrates a partially fabricated greatly enlarged simplified sectional view of a vertical cavity surface emitting laser.

FIG. 1 illustrates a partially fabricated greatly enlarged simplified sectional view of a vertical cavity surface emitting laser (VCSEL) 101. VCSEL 101 is fabricated to include several features or elements, such as a substrate 102 having a surface 103, a stack of distributed Bragg reflectors (DBRs) 106, a cladding region 107, an active region 108, a cladding region 109, a stack of DBRs 110, a contact region 111 including layers 116 and 118, a layer 120, a layer 122, a conductive layer 124, a layer or a seed layer 126, a dielectric layer 128, a dielectric area 132, a mesa or a ridge 131 having a surface 133, a trench 136 having surfaces 140, 141, 142, and a region 144. It should be understood that FIG. 1 only shows a sectional view of a portion of substrate 102, thereby enabling FIG. 1 to continue into and out of the drawing, as well as being able to extend laterally across the drawing. Thus, VCSEL 101 can represent one of a plurality of VCSELs that make an array. The present patent application is related to a copending patent application bearing Attorney Docket number CR94-107 entitled METHOD FOR MAKING A VCSEL, filed on Nov. 29, 1994, having Ser. No. 08/346,558 and assigned to the same assignee which is hereby incorporated by reference herein.

As shown in FIG. 1, VCSEL 101 is illustrated as being partially fabricated. For the purpose of orienting the reader, a brief description of materials and methods is provided. Briefly, VCSEL 101 is fabricated on any suitable substrate 102, such as silicon, gallium arsenide, indium gallium phosphide, or the like having surface 103. Surface 103 of substrate 102 is processed to form several epitaxial layers including the stack of DBRs 106, cladding region 107, active region 108, cladding region 109, the stack of DBRs 110. Contact region 111 is made to include layers 116 and 118, wherein layer 116 is an epitaxially deposited material, such as gallium arsenide that is p-doped, e.g., doped with zinc, and wherein layer 118 is an ohmic metal material, such as a metal, e.g., titanium, tungsten, or the like, or an alloy, such as titanium/tungsten.

Mesa 131 and trench 136 are formed by any suitable process or combination of processes, such as deposition, photolithography, etching, or the like. Generally, layer 120 is deposited on contact region 111. Layer 120 is made of any suitable dielectric material, such as nitride, oxynitride, silicon dioxide, or the like. A mask layer is then applied to layer 120. The mask layer is made of any suitable photoactive material, such as photoresist, polyimide, or the like. The mask layer is then patterned with a ring formation, thereby exposing portions of layer 120 and covering other portions of layer 120. The exposed portions of layer 120 are then etched or removed by any suitable method, such as a dry etch method, a wet etch method, or the like. Once the exposed portions of layer 120 are removed, portions of contact region 111 subsequently are exposed and etched, thereby removing or etching the exposed portions of contact region 111. Etching is continued until a desired depth is obtained, thereby transferring the ring pattern through contact region 111 and at least into DBRs 110 to make mesa or ridge 131 and trench 136.

Patterning of the mask layer is achieved by any suitable method well known in the art, such as photolithography. Additionally, it should be understood that as the etching of trench 136 continues, a continuous surface, indicated as surfaces 140, 141, and 142 is formed. However, it should be understood that variation of process parameters, as well as equipment types can produce trench 136 in a variety of geometric configurations, such a squared channel, a U-groove, a V-groove, or the like. While etching of trench 136 can be continued through the stack of DBRs 106 to surface 103 of substrate 102, in a preferred embodiment of the present invention, etching of trench 136 is continued until a distance 112 is reached in DBRs 110. Distance 112 is defined from cladding region 109 to surface 142 of trench 136. Typically, while any suitable distance can be used for distance 112, in a preferred embodiment of the present invention, distance 112 is less than 1.0 micron, with a nominal distance of less than 0.1 micron.

By way of example, with layer 120 being made of nitride, with layer 118 being made of titanium/tungsten, and with layer 116 being made of gallium arsenide, layers 120 and 118 are etched in a fluorine based plasma chemistry and layer 116 is etched and possibly continued with a chlorine based chemistry.

Region 144 illustrates a current confinement region that is optionally formed in the stack of DBRs 110 for specific applications of VCSEL 101. Generally, region 144 is formed by any suitable method such as ion implantation of any suitable ion, e.g., hydrogen, oxygen, or the like that disrupts epitaxial stacking of atoms in region 144, thereby inhibiting lateral spreading of current, thus confining the current and improving performance of VCSEL 101.

Once mesa 131 and trench 136 are properly formed, a layer 122 of any suitable dielectric material, such as silicon dioxide, nitride, oxynitride, or the like is deposited on layer 120, trench 136, and mesa 131. A masking layer similar to that previously described is then applied to layer 122 and patterned, thereby exposing a portion of layer 122 above surface 133 of mesa 131. Generally, patterning of the masking layer is achieved so that the portion of layer 122 above surface 133 of mesa 131 is fully exposed, while trench 136 and other portions of layer 122 are covered and protected by the masking layer. Layer 122 and any remaining material of layer 120 is then etched away or removed by any suitable method which has been described hereinabove. Thus, removing portions of layer 122 and 120 exposed on mesa 131 and exposing surface 133 of mesa 131.

After etching of layers 120 and 122 have been completed, conductive layer 124 is deposited or disposed on substrate 102 by any suitable method, such as evaporation, sputtering, or the like. Conductive layer 124 is made of any suitable conductive material, such as a metal, e.g., aluminum, copper, titanium, tungsten, or the like, an alloy, e.g., aluminum/copper, titanium/tungsten, or the like.

After the deposition of layer 124, layer or seed layer 126 is deposited or disposed on layer 124 by any suitable method, such as sputtering, evaporating, or the like, thereby covering layer 124 Generally, layer 126 can be made of any suitable material, such as a metal, e.g., nickel, gold, titanium, tungsten, or the like, an alloy, e.g., titanium/tungsten, or the like, thereby enabling selective plating onto these materials. However, in a preferred embodiment of the present invention, a gold material is deposited on layer 124, thereby providing seed layer 126 for subsequent processing.

Once layer 126 is properly formed, a masking layer 130 is applied to layer 126 and subsequently patterned in a similar fashion as previously described. Since masking or photolithography is noncritical, increase process latitude is gained, thus making VCSEL 101 more manufactureable. Generally, patterning of masking layer 130 is achieved so that the portion of layer 126 above surface 133 of mesa 131 is fully exposed, while trench and other portions of layer 126 are covered and protected by masking layer 130.

Dielectric layer 128 is then deposited or disposed on masking layer 130 and exposed portions of layer 126. As shown in FIG. 1, dielectric layer 128 forms a dielectric area 132 above mesa 131. Any suitable method, such as sputtering, evaporating, or the like can be used for depositing or disposing of dielectric layer 128 onto masking layer 130 and exposed portions of layer 126. Dielectric layer 128 is made of any suitable dielectric material, such as silicon dioxide, silicon nitride, oxynitride, or the like. Additionally, dielectric layer 128 is made to any suitable thickness 129 ranging from 5,000 Angstroms or less, with a preferred thickness ranging from 2,500 Angstroms or less, and a nominal thickness of 1,000 Angstroms or less.

Once dielectric layer 128 has been formed, masking layer 130 is removed, thereby lifting-off dielectric layer 128 on masking layer 130 and leaving dielectric area 132 on mesa 131.

Figure 2:
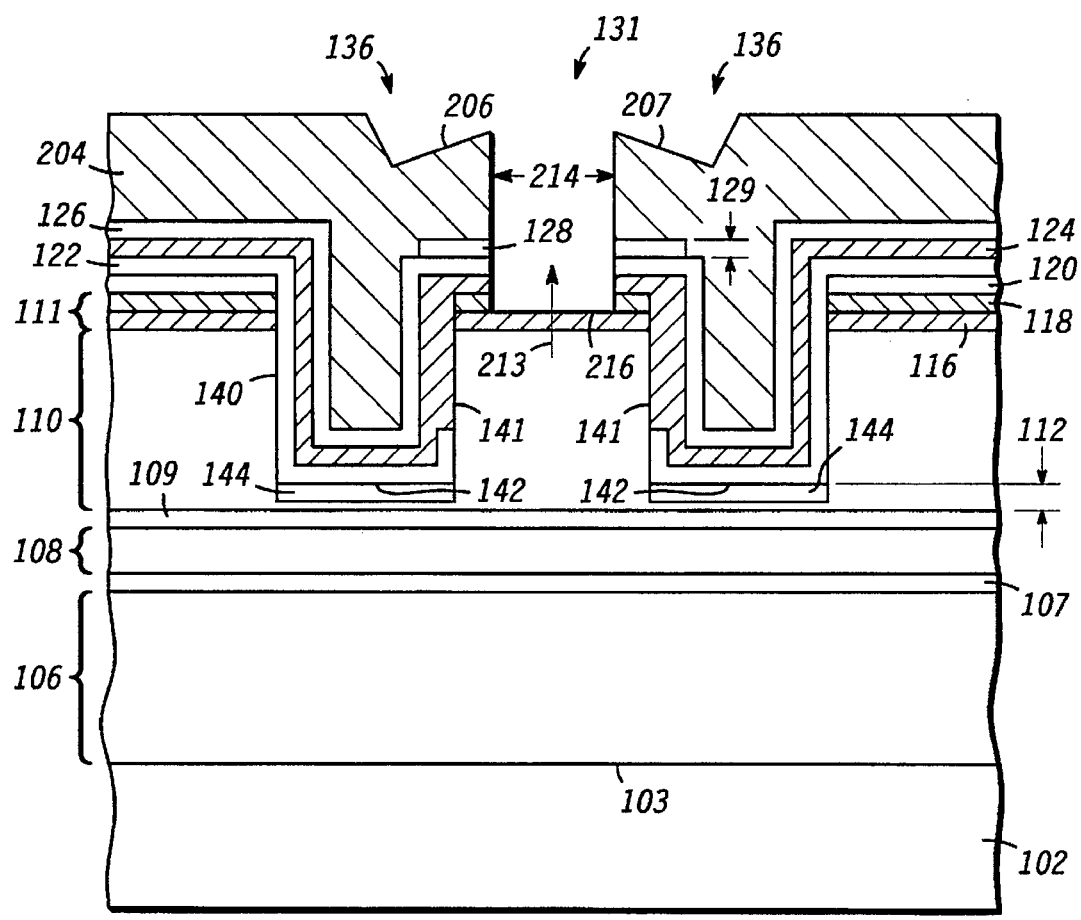
FIG. 2 illustrates the vertical cavity surface emitting laser shown in FIG. 1, in which the vertical cavity surface emitting laser has under gone further processing.

FIG. 2 illustrates a greatly enlarged simplified sectional view of vertical cavity surface emitting laser 201, shown in FIG. 1, having under gone further processing. It should be understood that similar features or elements previously identified in FIG. 1 will retain their original identifying numerals. It should be further understood that FIG. 2 only shows a sectional view of a portion of substrate 102, thereby enabling FIG. 2 to continue into and out of the drawing, as well as being able to extend laterally across the drawing, thus enabling VCSEL 201 represent one of an array of VCSELs.

Once masking layer 126 and dielectric layer 128 thereon have been removed, substrate 102 is subjected to a selective deposition process, such as an electroplating or an electrodeposition process, an electroless deposition process, or the like. Generally, the electroplating process is performed in an electroplating system that can include a reservoir, a pumping mechanism, a baffle, a fountain cup, an anode, and a cathode. Generally, an electroplating solution is pumped from the reservoir, passed the anode, through the baffle, into the fountain cup, and passed the cathode. Flow rates of the electroplating solution can range from 0 to 27 litters per minute, with temperatures ranging from 20.0 to 60.0 degrees Celsius. It should be understood that a flow rate of 0 liters per second means that the electroplating solution is contained in the fountain cup.

Any suitable bias source such as a DC Bias or the like can be applied across the anode and cathode; however, in a preferred embodiment of the present invention, the bias has a current density ranging from approximately 1 milliampere per square centimeter to 12 milliamperes per square centimeter. Additionally, the current can be a pulsed current train having a frequency ranging from 10 to 4,000 Hertz with a duty cycle of at least 10 percent. The pulsed current train can be modulated so that the pulse is on for a time ranging between approximately one millisecond and three seconds. Additionally, it should be understood that any suitable bias can be used, such as a DC Bias or the like.

Generally, any suitable plating solution having a plateable metal, such as gold, nickel, copper, or the like can be used; however, in a preferred embodiment of the present invention the plating solution is an electroplating solution that includes a mixture of sulfite based gold which may also include a brightener. In a preferred embodiment of the present invention, the electroplating solution is a sulfite based plating solution sold under the trademark "SELREX" or "NEUTRONEX" 309 produced by Entone-OMI Inc., wherein "SEL-REX" and "NEUTRONEX" 309 includes a "NEUTRONEX" make-up solution, a "NEUTRONEX" 309 Replentisher solution, and a "NERTRONEX" 309 Conducting salts solution. Adjustments in pH of the electroplating solution can be any suitable acid or base, such as sodium hydride or sulfuric acid. In a preferred embodiment of the electroplating solution, gold concentration ranges from 10.272 to 12.326 grams per litter of electroplating solution, with thallium as the brightener. Thallium concentration can range from 20 to 100 milligrams per litter, with a nominal concentration of 75 milligrams per liter. It should be understood that while specific concentrations are provided hereinabove these specific concentrations vary with specific types of electroplating systems.

Once the selective plating process is completed, layer 204 is formed on layer 126, thereby fabricating a self-aligned integrated heat sink on VCSEL 201. Generally, thickness 211 of layer 204 can be any suitable thickness ranging range from 500 Angstroms to 10 microns, with a preferred range from 2 to 8 microns, with a nominal range from 3 to 7 microns. It should be understood that as thickness 211 increases heat conducting efficiency of layer 204 increases. Additionally, in a preferred embodiment of the present invention, the plating process is continued until portions 206 and 207 are formed. It should be understood that, typically, VCSEL 201 has a circular shape, thus portions 206 and 207 can be physically connected (not shown). As portions 206 and 207 grow, portion 206 and 207 encroach upon each other on dielectric area 132, thereby forming emission hole 210. By generating portions 206 and 207, a method for controlling a diameter 214 of an aperture or an emission hole 210 is provided, thus enabling a smaller spot size to be emitted from VVCSEL 201

By selectively forming layer 204 on layer 126, layer 204 provides a self-aligned heat conductive layer that carries heat away from VCSEL 201 during operation, as well as providing an electrical contact for VCSEL 201. Further, by removing heat away from VCSEL 201 during operation, VCSEL 201 has improved reliability and performance. First, since heat is dissipated more evenly and quickly, stress caused by differing coefficients of expansion is reduce, thereby improving life-time reliability, cracking of substrate 102, and a more even output of light from VCSEL 201. Additionally, since layer 204 is fabricated by self-aligned process, many additional processing steps are not necessary, thereby significantly simplifying fabrication of VCSEL 201.

Once formation of layer 204 is completed, VCSEL 201 is etched by any suitable method such as a dry etch to expose a surface 216, thereby allowing light 213 to be emitted from VCSEL 201.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

By now it should be appreciated that a novel article and method for making have been provided. VCSEL has an improved heat removal, thereby providing improved device stability, improved life-time reliability, and improved manufacturability. Additionally, since the heat conducting material is selectively plated on VCSEL, the heat conducting material is disposed on VCSEL with a minimum of process steps, as well as having the heat conducting material being disposed on VCSEL in a self-align manner, thereby further improving manufactureability.

What is claimed is:

1. A method for making a VCSEL with a self-aligned integrated heat sink comprising the steps of:

provinding a substrate having a surface with a first stack of distributed Bragg reflectors, a first cladding region, an active region, a second cladding region, a second stack of distributed Bragg reflectors, and a contact region;

forming a first dielectric layer on said contact region;

forming a mesa with a surface and a trench, wherein said trench extends from said first dielectric layer into a portion of said second stack of distributed Bragg reflectors, and wherein said trench is adjacent to a portion of said mesa;

forming a second dielectric layer overlying said substrate so that a portion of said second dielectric layer covers a portion of said trench while exposing a portion of said contact region on said mesa;

forming a conductive layer on said second dielectric layer and on said mesa;

forming a seed layer on said conductive layer;

forming a dielectric area on said seed layer above said surface of said mesa; and plating a metal selectively on said seed layer generating a layer on said seed layer for removal of heat, thereby generating an integrated heat sink.

2. A method for making a VCSEL with a self-aligned integrated heat sink as claimed in claim 1 where, in the step of providing a substrate having a surface with a first stack of distributed Bragg reflectors, a first cladding region, an active region, a second cladding region, a second stack of distributed Bragg reflectors, and a contact region, the contact region is provided by including depositing a titanium/tungsten layer.

3. A method for making a VCSEL with a self-aligned integrated heat sink as claimed in claim 1 where, in the step of forming a mesa with a surface and a trench, said mesa with said surface and said trench are formed by a dry etch process.

4. A method for making a VCSEL with a self-aligned integrated heat sink as claimed in claim 1 where, in the step of forming a seed layer, the seed layer is formed by a deposition process.

5. A method for making a VCSEL with a self-aligned integrated heat sink as claimed in claim 1 where, prior to the step of forming a second dielectric layer overlying said substrate and covering a portion of said trench, the step of forming a current confinement region in said trench is performed.

6. A method for making a VCSEL with a self-aligned integrated heat sink as claimed in claim 5 where, in the step of forming a current confinement region, the current confinement region is fabricated by changing structural integrity of a portion of the second stack of the distributed Bragg reflectors.

7. A method for making a VCSEL with a self-aligned integrated heat sink as claimed in claim 5 where, in the step of forming a current confinement region, the current confinement region is fabricated by ion implantation.

8. A method for making a VCSEL having a heat sink comprising the steps of:

forming a partially fabricated VCSEL having a mesa with a surface and a trench adjacent to the mesa, the surface of the mesa being centrally located;

forming a seed layer in the trench and on the mesa;

forming a dielectric area on the surface of the mesa; and plating a second metal selectively on the seed layer, thereby generating a VCSEL.

9. A method for making a VCSEL having a heat sink as claimed in claim 8 where, in the step of forming a seed layer in the trench and on the mesa, the seed layer is formed by depositing gold material.

10. A method for making a VCSEL having a heat sink as claimed in claim 8 where, in the step of forming a seed layer in the trench and on the mesa, the seed layer is formed by sputtering.

11. A method for making a VCSEL having a heat sink as claimed in claim 8 where, in the step of plating a second metal selectively on the seed layer, the second metal selectively plated is gold.

12. A method for making a VCSEL having a heat sink as claimed in claim 8 where, in the step of forming a partially fabricated VCSEL having a mesa with a surface and a trench adjacent to the mesa, a step of forming a current confinement region is included.

13. A method for making a VCSEL having a heat sink as claimed in claim 12 where, in the step of forming a current confinement region, the current confinement region is fabricated by changing structural integrity of a portion of the trench.

14. A method for making a VCSEL having a heat sink as claimed in claim 12 where, in the step of forming a current confinement region, the current confinement region is fabricated by ion implantation.

15. A method for making a VCSEL having auto-aligned heat sink comprising the steps of:

provoking a substrate having a surface with a first stack of distributed Bragg reflectors, a first cladding region, an active region, a second cladding region, a second stack of distributed Bragg reflectors, and a contact region;

forming a layer on the contact region;

forming a masking layer having a ring shaped pattern on the layer, the ring shaped pattern of the masking layer exposes portions of the layer, while covering other portions of the layer;

etching the exposed portions of the layer, thereby removing exposed portions of the layer and exposing portions of the contact region;

etching the exposed portions of the contact region and into a portion of the second stack of distributed Bragg reflectors to form a mesa, thereby forming a trench adjacent to the mesa;

forming a dielectric layer overlying portions of the contact region and covering a portion of the trench;

forming a seed layer overlying the substrate;

forming a dielectric area on the seed layer; and plating a second metal selectively on the seed layer, thereby selectively plating the second metal on the seed layer and exposing a portion of the dielectric area.

16. A method for making a VCSEL having auto-aligned heat sink as claimed in claim 15 wherein after the step of plating the second metal on the seed layer, the portion of the dielectric area exposed is etched to expose a portion of the contact region, thereby generating a VCSEL.

17. A method for sizing an emission hole of a VCSEL comprising the steps of:

providing a substrate having a surface with a first stack of distributed Bragg reflectors, a first cladding region, an active region, a second cladding region, a second stack of distributed Bragg reflectors, and a contact region;

forming a first dielectric layer on said contact region;

forming a mesa with a surface and a trench, wherein said trench extends from said first dielectric layer into a portion of said second stack of distributed Bragg reflectors, and wherein said trench is adjacent to a portion of said mesa;

forming a second dielectric layer overlying said substrate so that a portion of said second dielectric layer covers a portion of said trench while exposing a portion of said contact region on said mesa;

forming a conductive layer on said second dielectric layer and on said mesa;

forming a seed layer on said conductive layer;

forming a dielectric area on said seed layer above said surface of said mesa; and plating a metal selectively on said seed layer generating a layer on said seed layer, as well as generating portions that encroach on the dielectric area, thereby sizing an emission hole of the VCSEL.

* * * * *